United States Patent
Noguera Serra et al.

(10) Patent No.: US 11,853,235 B2
(45) Date of Patent: *Dec. 26, 2023

(54) COMMUNICATING BETWEEN DATA PROCESSING ENGINES USING SHARED MEMORY

(71) Applicant: XILINX, INC., San Jose, CA (US)

(72) Inventors: Juan J. Noguera Serra, San Jose, CA (US); Goran Hk Bilski, Molndal (SE); Baris Ozgul, Dublin (IE); Jan Langer, Chemnitz (DE)

(73) Assignee: XILINX, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/826,068

(22) Filed: May 26, 2022

(65) Prior Publication Data

US 2022/0283963 A1    Sep. 8, 2022

Related U.S. Application Data (63) Continuation of application No. 15/944,179, filed on Apr. 3, 2018, now Pat. No. 11,379,389.

(51) Int. Cl.
*G06F 13/16* (2006.01)
*G06F 12/084* (2016.01)
(Continued)

(52) U.S. Cl.
CPC .......... *G06F 13/1663* (2013.01); *G06F 9/544* (2013.01); *G06F 12/084* (2013.01); *G06F 15/167* (2013.01); *G11C 8/16* (2013.01)

(58) Field of Classification Search
CPC .... G06F 13/1663; G06F 9/544; G06F 12/084; G06F 15/167; G11C 8/16
See application file for complete search history.

(56) References Cited

U.S. PATENT DOCUMENTS

| | | |
|---|---|---|
| 3,776,137 A | 12/1973 | Abbott |
| 4,876,641 A | 10/1989 | Cowley |

(Continued)

FOREIGN PATENT DOCUMENTS

| | | |
|---|---|---|
| WO | 2019195132 A1 | 10/2019 |
| WO | 2019195309 A2 | 10/2019 |
| WO | 2019195343 A1 | 10/2019 |

OTHER PUBLICATIONS

Mellanox, "Bluefield Multicore System on Chip," copyright 2017, 4 pp., Mellanox Technologies, Sunnyvale, California, USA.

(Continued)

*Primary Examiner* — Kalpit Parikh
(74) *Attorney, Agent, or Firm* — Patterson + Sheridan, LLP (57) ABSTRACT

Examples herein describe techniques for transferring data between data processing engines in an array using shared memory. In one embodiment, certain engines in the array have connections to the memory in neighboring engines. For example, each engine may have its own assigned memory module which can be accessed directly (e.g., without using a streaming or memory mapped interconnect). In addition, the surrounding engines (referred to herein as the neighboring engines) may also include direct connections to the memory module. Using these direct connections, the cores can load and/or store data in the neighboring memory modules.

20 Claims, 9 Drawing Sheets

(51) Int. Cl.
  *G06F 9/54* (2006.01)
  *G11C 8/16* (2006.01)
  *G06F 15/167* (2006.01)

(56) References Cited

U.S. PATENT DOCUMENTS

| | | | |
|---|---|---|---|
| 6,091,263 | A | 7/2000 | New et al. |
| 6,150,839 | A | 11/2000 | New et al. |
| 6,204,687 | B1 | 3/2001 | Schultz et al. |
| 6,462,579 | B1 | 10/2002 | Camilleri et al. |
| 6,526,557 | B1 | 2/2003 | Young et al. |
| 6,759,869 | B1 | 7/2004 | Young et al. |
| 6,810,514 | B1 | 10/2004 | Alfke et al. |
| 6,836,842 | B1 | 12/2004 | Guccione et al. |
| 6,907,595 | B2 | 6/2005 | Curd et al. |
| 7,024,651 | B1 | 4/2006 | Camilleri et al. |
| 7,057,413 | B1 | 6/2006 | Young et al. |
| 7,124,338 | B1 | 10/2006 | Mark et al. |
| 7,224,184 | B1 | 5/2007 | Levi et al. |
| 7,302,625 | B1 | 11/2007 | Payakapan et al. |
| 7,394,288 | B1 | 7/2008 | Agarwal |
| 7,477,072 | B1 | 1/2009 | Kao et al. |
| 7,478,357 | B1 | 1/2009 | Mason et al. |
| 7,482,836 | B2 | 1/2009 | Levi et al. |
| 7,509,617 | B1 | 3/2009 | Young |
| 7,518,396 | B1 | 4/2009 | Kondapalli et al. |
| 7,546,572 | B1 | 6/2009 | Ballagh et al. |
| 7,619,442 | B1 | 11/2009 | Mason et al. |
| 7,640,527 | B1 | 12/2009 | Dorairaj et al. |
| 7,724,815 | B1 | 5/2010 | Raha et al. |
| 7,746,099 | B1 | 6/2010 | Chan et al. |
| 8,045,546 | B1 | 10/2011 | Bao et al. |
| 8,102,188 | B1 | 1/2012 | Chan et al. |
| 8,250,342 | B1 | 8/2012 | Kostarnov et al. |
| 8,359,448 | B1 | 1/2013 | Neuendorffer |
| 8,415,974 | B1 | 4/2013 | Lysaght |
| 8,719,750 | B1 | 5/2014 | Balzli, Jr. |
| 8,796,539 | B2 | 8/2014 | Asaumi et al. |
| 8,928,351 | B1 | 1/2015 | Konduru |
| 9,081,634 | B1 | 7/2015 | Simkins et al. |
| 9,436,785 | B1 | 9/2016 | Javre |
| 9,448,940 | B2 * | 9/2016 | Shalf ............... G06F 12/0813 |
| 9,722,613 | B1 | 8/2017 | Schultz et al. |
| 9,990,241 | B2 | 6/2018 | Dobbs |
| 10,747,690 | B2 | 8/2020 | Bilski et al. |
| 10,866,753 | B2 | 12/2020 | Noguera Serra et al. |
| 2008/0082759 | A1 | 4/2008 | Pong |
| 2014/0006751 | A1 | 1/2014 | Aliseychik et al. |
| 2014/0267334 | A1 | 9/2014 | Duluk, Jr. |
| 2016/0011996 | A1 | 1/2016 | Asaad et al. |
| 2017/0220499 | A1 | 8/2017 | Gray |
| 2017/0315944 | A1 | 11/2017 | Mayer et al. |
| 2019/0155666 | A1 | 5/2019 | Dobbs |
| 2019/0303033 | A1 | 10/2019 | Noguera Serra et al. |
| 2019/0303311 | A1 | 10/2019 | Bilski et al. |
| 2019/0303328 | A1 | 10/2019 | Balski et al. |

OTHER PUBLICATIONS

Mellanox, "NP-5 Network Processor," copyright 2107, 2 pp., Mellanox Technologies, Sunnyvale, California, USA.

Mellanox, "Tile-Gx672 Processor," PB041, Feb. 14, 2015, 2 pp., Mellanox Technologies, Sunnyvale, California, USA.

Kalray, "Kalray NVMe-oF Target Controller Solutions," Dec. 18, 2017, 14 pp., Kalray Inc., Los Altos, California, USA.

EZchip, "Tile-Gx72 Processor," PB041, Feb. 14, 2015, 2 pp., EZchip Semiconductor, Inc., San Jose, California, USA.

Schooler, Richard, "Tile Processors: Many-Core for Embedded and Cloud Computing," Sep. 15, 2010, 35 pp., 14th Annual Workshop on High Performance Embedded Computing (HPEC '10).

Doud, Bob, "Accelerating the Data Plane with the Tile-Mx Manycore Processor," Feb. 25, 2015, 19 pp., Linley Data Center Conference, EZchip Semiconductor, Inc., San Jose, California, USA.

Wentzlaff, David et al., "On-Chip Interconnection Architecture of the Tile Processor," IEEE Micro, Nov. 12, 2007, pp. 15-31, vol. 27, Issue 5, IEEE Computer Society Press, Los Alamitos, California, USA.

Kalray, "MPPA Processors for Autonomous Driving," May 25, 2017, 18 pp., Kalray Inc., Los Altos, California, USA.

Kalray, "Deep Learning for High-Performance Embedded Applications," 19 pp., Kalray Inc., Los Altos, California, USA.

Xilinx, UltraScale Architecture DSP Slice, UG579, Oct. 18, 2017, 74 pp., Xilinx, Inc., San Jose, California, USA.

Xilinx, Inc., "AXI4-Stream Internconnect v1.1, LogiCORE IP Product Guide," PG035, Vivado Design Suite, Chap. 2: Product Specification, Chap. 3: Designing With the Core, Oct. 4, 2017, 44 pg., Xilinx, Inc., San Jose, California, USA.

Xilinx, Inc., PCT International Application No. PCT/US2019/025414, Invitation to Pay Additional Fees, Communication Relating to the Results of The Partial International Search, and Provisional Opinion Accompanying the Partial Search Result, dated Jul. 5, 2019, 12 pg.

Stocksdale et al., Architecting HBM as a High Bandwidth, High Capacity, Self-Managed Last-Level Cache, Nov. 2017, PDSW-DSICS' 17 Denver, CO, USA (Year:2017).

* cited by examiner

FIG. 9

COMMUNICATING BETWEEN DATA PROCESSING ENGINES USING SHARED MEMORY

CROSS REFERENCE TO RELATED APPLICATION

This application is a continuation of U.S. Non-Provisional application Ser. No. 15/944,179, filed on Apr. 3, 2018 of which is incorporated herein in by reference in its entirety.

TECHNICAL FIELD

Examples of the present disclosure generally relate to communicating between data processing engines (DPEs) in an array using shared memory.

BACKGROUND

A processor, a system on a chip (SoC), and an application specific integrated circuit (ASIC) can include multiple cores for performing compute operations such as processing digital signals, performing cryptography, executing software applications, rendering graphics, and the like. In some examples, the cores may transmit data between each other when performing the compute operations. Typically, transferring data between cores requires the data to pass through a core-to-core interface that adds latency and is an inefficient use of memory.

SUMMARY

Techniques for transferring data between data processing engines are described. One example is a method that includes processing data in a first data processing engine in a 2D array of data processing engines disposed in a same integrated circuit where each data processing engine comprises a respective processing core and a local memory, storing the processed data in a first local memory in the first data processing engine, retrieving at least a portion of the processed data from the first local memory using a first direct neighbor connection that directly couples the first local memory in the first data processing engine to a processing core in a second data processing engine in the 2D array, retrieving at least a portion of the processed data from the first local memory using a second direct neighbor connection that directly couples the first local memory in the first data processing engine to a processing core in a third data processing engine in the 2D array where the second data processing engine is in a different row than the third data processing engine in the 2D array.

One example described herein is a SoC that includes a first data processing engine in a 2D array of data processing engines where the first data processing engine includes a respective core and a first local memory and the first data processing engine is configured to store processed data in the first local memory. The SoC also includes a second data processing engine in the 2D array, the second data processing engine configured to retrieve at least a portion of the processed data from the first memory using a first direct neighbor connection that directly couples the first memory in the first data processing engine to a processing core in the second data processing engine and a third data processing engine in the 2D array configured to retrieve at least a portion of the processed data from the first memory using a second direct neighbor connection that directly couples the first memory in the first data processing engine to a processing core in the third data processing engine, wherein the second data processing engine is in a different row than the third data processing engine in the 2D array.

One example described herein is a SoC that includes a first data processing engine in a 2D array of data processing engines where the first data processing engine includes a respective core and a first local memory and the first data processing engine is configured to store processed data in the first local memory. The SoC also includes a second data processing engine in the 2D array, the second data processing engine configured to retrieve at least a portion of the processed data from the first memory using a first direct neighbor connection that directly couples the first memory in the first data processing engine to a processing core in the second data processing engine and a third data processing engine in the 2D array configured to retrieve at least a portion of the processed data from the first memory using a second direct neighbor connection that directly couples the first memory in the first data processing engine to a processing core in the third data processing engine, wherein the second data processing engine is in a different column than the third data processing engine in the 2D array.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Examples herein describe techniques for transferring data between cores in an array using shared memory. In one embodiment, certain cores in the array have connections to the memory in neighboring cores. For example, each core may have its own assigned memory module which can be accessed directly (e.g., without using a streaming or memory mapped interconnect). In addition, the surrounding cores (referred to herein as the neighboring cores) may also include direct connections to the memory module. Using these direct connections, the cores can read or store data in the neighboring memory modules.

Transferring data using a shared memory may reduce latency relative to using an interconnect network. For example, the array may include a streaming or memory mapped network that permits each of the cores to share data. However, accessing and transmitting data using the interconnect may take more clock cycles than reading or writing to shared memory. Thus, by providing direct connections to memory modules in neighboring cores, the array can improve the speed at which neighboring cores can transmit data.

Figure 1:
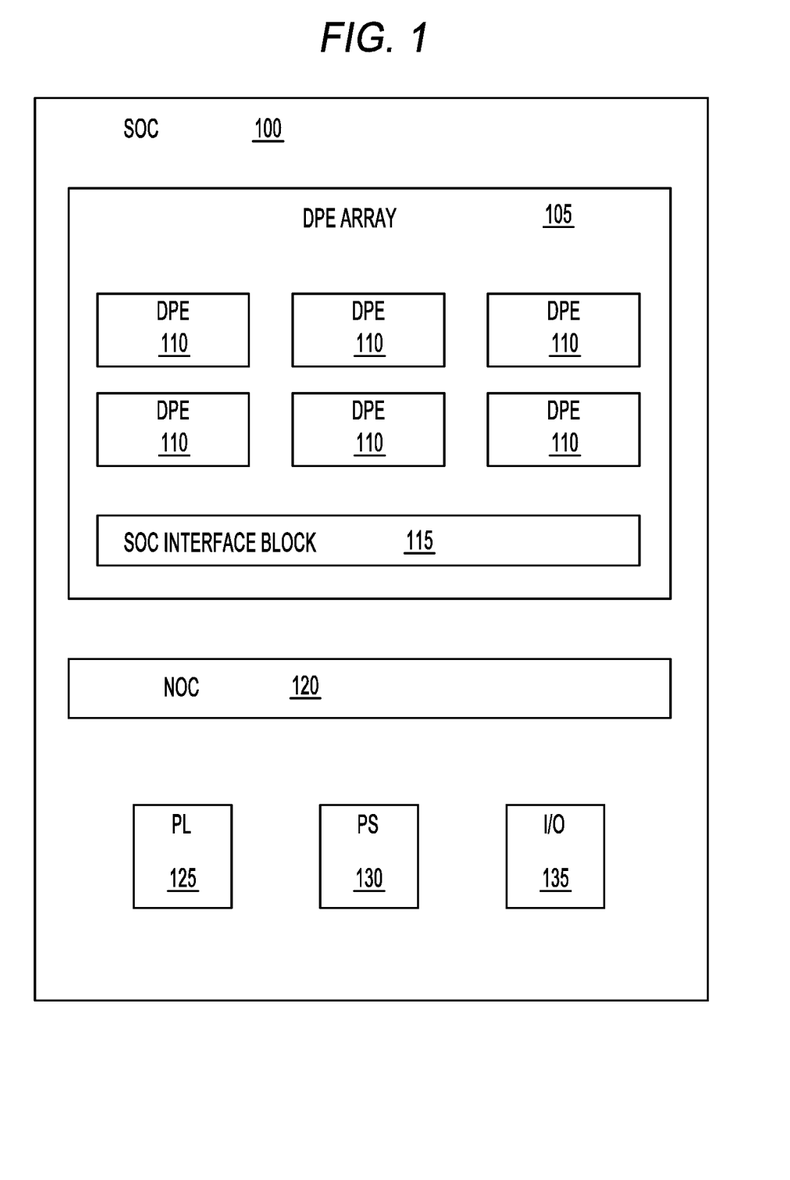
FIG. 1 is a block diagram of a SoC that includes a DPE array, according to an example.

FIG. 1 is a block diagram of a SoC 100 that includes a DPE array 105, according to an example. The DPE array 105 includes a plurality of DPEs 110 which may be arranged in a grid, cluster, or checkerboard pattern in the SoC 100. Although FIG. 1 illustrates arranging the DPEs 110 in a 2D array with rows and columns, the embodiments are not limited to this arrangement. Further, the array 105 can be any size and have any number of rows and columns formed by the DPEs 110.

In one embodiment, the DPEs 110 are identical. That is, each of the DPEs 110 (also referred to as tiles or blocks) may have the same hardware components or circuitry. Further, the embodiments herein are not limited to DPEs 110. Instead, the SoC 100 can include an array of any kind of processing elements, for example, the DPEs 110 could be digital signal processing engines, cryptographic engines, Forward Error Correction (FEC) engines, or other specialized hardware for performing one or more specialized tasks.

In FIG. 1, the array 105 includes DPEs 110 that are all the same type (e.g., a homogeneous array). However, in another embodiment, the array 105 may include different types of engines. For example, the array 105 may include digital signal processing engines, cryptographic engines, graphic processing engines, and the like. Regardless if the array 105 is homogenous or heterogeneous, the DPEs 110 can include direct connections between DPEs 110 which permit the DPEs 110 to transfer data directly as described in more detail below.

In one embodiment, the DPEs 110 are formed from non-programmable logic—i.e., are hardened. One advantage of doing so is that the DPEs 110 may take up less space in the SoC 100 relative to using programmable logic to form the hardware elements in the DPEs 110. That is, using hardened or non-programmable logic circuitry to form the hardware elements in the DPE 110 such as program memories, an instruction fetch/decode unit, fixed-point vector units, floating-point vector units, arithmetic logic units (ALUs), multiply accumulators (MAC), and the like can significantly reduce the footprint of the array 105 in the SoC 100. Although the DPEs 110 may be hardened, this does not mean the DPEs 110 are not programmable. That is, the DPEs 110 can be configured when the SoC 100 is powered on or rebooted to perform different functions or tasks.

The DPE array 105 also includes a SoC interface block 115 (also referred to as a shim) that serves as a communication interface between the DPEs 110 and other hardware components in the SoC 100. In this example, the SoC 100 includes a network on chip (NoC) 120 that is communicatively coupled to the SoC interface block 115. Although not shown, the NoC 120 may extend throughout the SoC 100 to permit the various components in the SoC 100 to communicate with each other. For example, in one physical implementation, the DPE array 105 may be disposed in an upper right portion of the integrated circuit forming the SoC 100. However, using the NoC 120, the array 105 can nonetheless communicate with, for example, programmable logic (PL) 125, a processor subsystem (PS) 130 or input/output (I/O) 135 which may disposed at different locations throughout the SoC 100.

In addition to providing an interface between the DPEs 110 and the NoC 120, the SoC interface block 115 may also provide a connection directly to a communication fabric in the PL 125. In one embodiment, the SoC interface block 115 includes separate hardware components for communicatively coupling the DPEs 110 to the NoC 120 and to the PL 125 that is disposed near the array 105 in the SoC 100.

Although FIG. 1 illustrates one block of PL 125, the SoC 100 may include multiple blocks of PL 125 (also referred to as configuration logic blocks) that can be disposed at different locations in the SoC 100. For example, the SoC 100 may include hardware elements that form a field programmable gate array (FPGA). However, in other embodiments, the SoC 100 may not include any PL 125—e.g., the SoC 100 is an ASIC.

Figure 2:
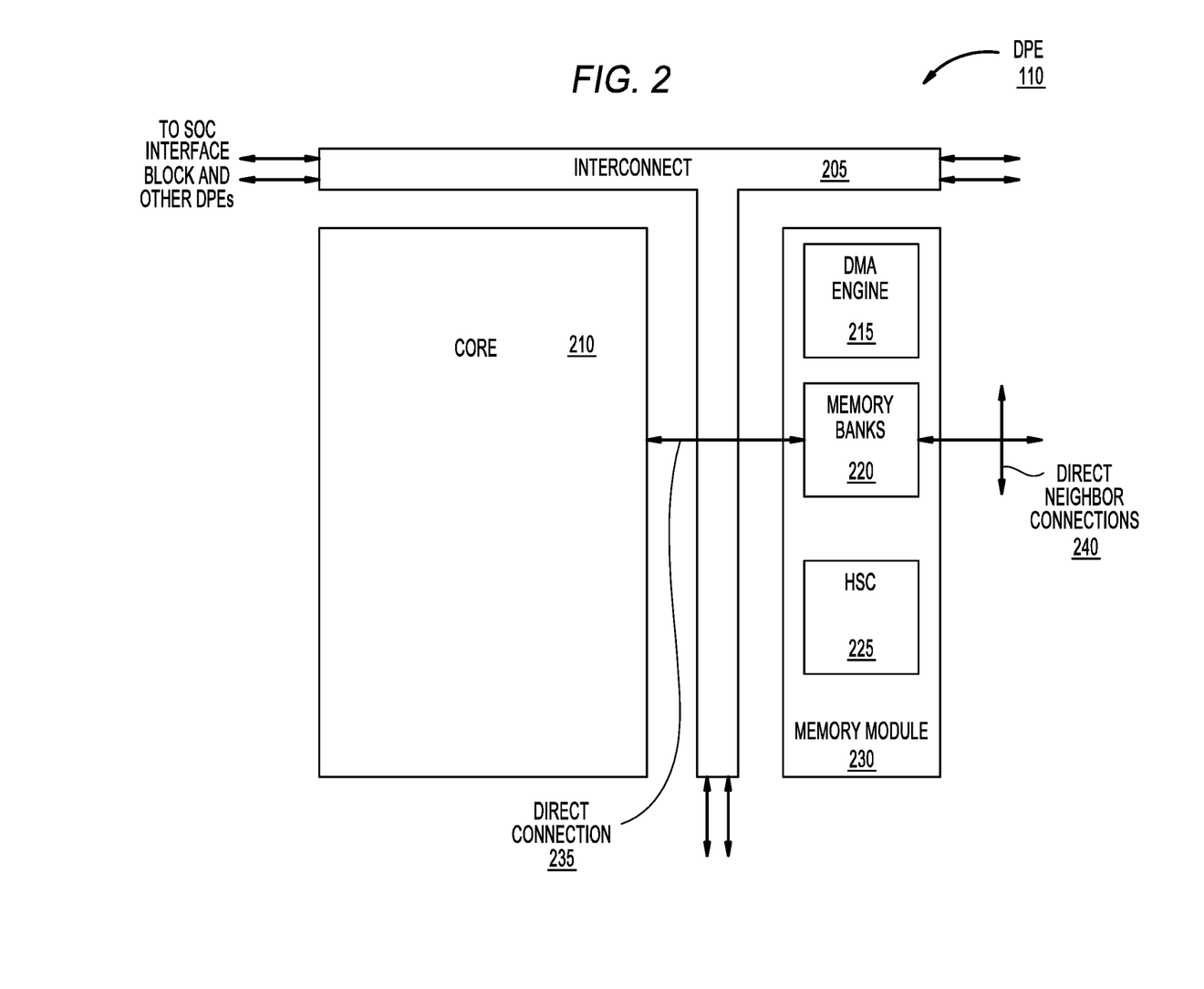
FIG. 2 is a block diagram of a DPE in the DPE array, according to an example.

FIG. 2 is a block diagram of a DPE 110 in the DPE array 105 illustrated in FIG. 1, according to an example. The DPE 110 includes an interconnect 205, a core 210, and a memory module 230. The interconnect 205 permits data to be transferred from the core 210 and the memory module 230 to different cores in the array 105. That is, the interconnect 205 in each of the DPEs 110 may be connected to each other so that data can be transferred north and south (e.g., up and down) as well as east and west (e.g., right and left) in the array of DPEs 110.

Referring back to FIG. 1, in one embodiment, the DPEs 110 in the upper row of the array 105 relies on the interconnects 205 in the DPEs 110 in the lower row to communicate with the SoC interface block 115. For example, to transmit data to the SoC interface block 115, a core 210 in a DPE 110 in the upper row transmits data to its interconnect 205 which is in turn communicatively coupled to the interconnect 205 in the DPE 110 in the lower row. The interconnect 205 in the lower row is connected to the SoC interface block 115. The process may be reversed where data intended for a DPE 110 in the upper row is first transmitted from the SoC interface block 115 to the interconnect 205 in the lower row and then to the interconnect 205 in the upper row that is the target DPE 110. In this manner, DPEs 110 in the upper rows may rely on the interconnects 205 in the DPEs 110 in the lower rows to transmit data to and receive data from the SoC interface block 115.

In one embodiment, the interconnect 205 includes a configurable switching network that permits the user to determine how data is routed through the interconnect 205. In one embodiment, unlike in a packet routing network, the interconnect 205 may form streaming point-to-point connections. That is, the electrical paths and streaming interconnects or switches (not shown) in the interconnect 205 may be configured to form routes from the core 210 and the memory module 230 to the neighboring DPEs 110 or the SoC interface block 115. Once configured, the core 210 and the memory module 230 can transmit and receive streaming data along those routes. In one embodiment, the interconnect 205 is configured using the Advanced Extensible Interface (AXI) 4 Streaming protocol.

In addition to forming a streaming network, the interconnect 205 may include a separate network for programming or configuring the hardware elements in the DPE 110. Although not shown, the interconnect 205 may include a memory mapped interconnect which includes different electrical paths and switch elements used to set values of configuration registers in the DPE 110 that alter or set functions of the streaming network, the core 210, and the memory module 230.

The core 210 may include hardware elements for processing digital signals. For example, the core 210 may be used to process signals related to wireless communication, radar, vector operations, machine learning applications, and the like. As such, the core 210 may include program memories, an instruction fetch/decode unit, fixed-point vector units, floating-point vector units, arithmetic logic units (ALUs), multiply accumulators (MAC), and the like. However, as mentioned above, this disclosure is not limited to DPEs 110. The hardware elements in the core 210 may change depending on the engine type. That is, the cores in a digital signal processing engine, cryptographic engine, or FEC may be different.

The memory module 230 includes a direct memory access (DMA) engine 215, memory banks 220, and hardware synchronization circuitry (HSC) 225 or other type of hardware synchronization block. In one embodiment, the DMA engine 215 enables data to be received by, and transmitted to, the interconnect 205. That is, the DMA engine 215 may be used to perform DMA reads and write to the memory banks 220 using data received via the interconnect 205 from the SoC interface block or other DPEs 110 in the array.

The memory banks 220 can include any number of physical memory elements (e.g., SRAM). For example, the memory module 230 may be include 4, 8, 16, 32, etc. different memory banks 220 where each of these banks 220 can include respective arbitration circuitry or logic. In this embodiment, the core 210 has a direct connection 235 to the memory banks 220. Stated differently, the core 210 can write data to, or read data from, the memory banks 220 without using the interconnect 205. As used herein, a "direct" connection means that the core 210 and the memory module 230 can communicate without using the interconnect 205 (e.g., the streaming network in the interconnect 205). That is, the direct connection 235 may be separate from the interconnect 205. In one embodiment, one or more wires in the direct connection 235 communicatively couple the core 210 to a memory interface in the memory module 230 which is in turn coupled to the memory banks 220.

In one embodiment, the memory module 230 also has direct connections 240 to cores in neighboring DPEs 110. Put differently, a neighboring DPE in the array can read data from, or write data into, the memory banks 220 using the direct neighbor connections 240 without relying on their interconnects or the interconnect 205 shown in FIG. 2. The HSC 225 can be used to govern or protect access to the memory banks 220. In one embodiment, before the core 210 or a core in a neighboring DPE can read data from, or write data into, the memory banks 220, the core 210 requests access to the HSC 225 (e.g., a lock request) the HSC 225 grants a lock to an assigned portion of the memory banks 220 (referred to as a "buffer"). That is, when the core 210 wants to write data, the HSC 225 provides a lock to the core 210 which assigns a portion of a memory bank 220 (or multiple memory banks 220) to the core 210. Once the write is complete, the core can release the lock which permits cores in neighboring DPEs to read the data.

Because the core 210 and the cores in neighboring DPEs 110 can directly access the memory module 230, the memory banks 220 can be considered as shared memory between the DPEs 110. That is, the neighboring DPEs can directly access the memory banks 220 in a similar way as the core 210 that is in the same DPE 110 as the memory banks 220. Thus, if the core 210 wants to transmit data to a core in a neighboring DPE, the core 210 can write the data into the memory bank 220. The neighboring DPE can then retrieve the data from the memory bank 220 and begin processing the data. In this manner, the cores in neighboring DPEs 110 can transfer data using the HSC 225 while avoiding the extra latency introduced when using the interconnects 205. In contrast, if the core 210 wants to transfer data to a non-neighboring DPE in the array (i.e., a DPE without a direct connection 240 to the memory module 230), the core 210 uses the interconnects 205 to route the data to the memory module of the target DPE which may take longer to complete because of the added latency of using the interconnect 205 and because the data is copied into the memory module of the target DPE rather than being read from a shared memory module.

Figure 3A:
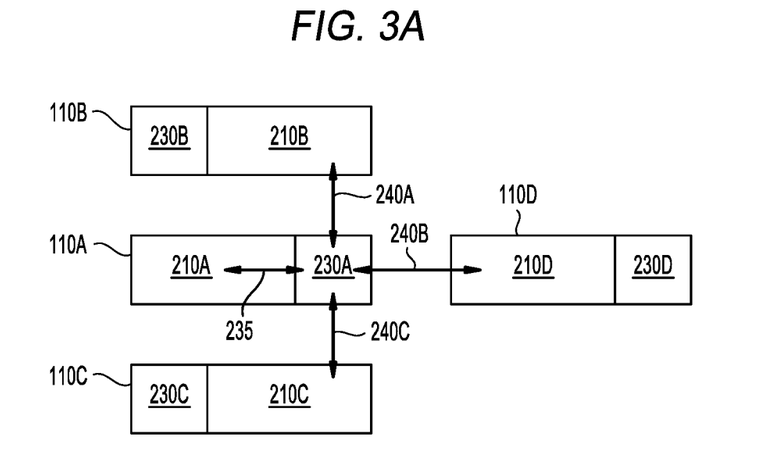
FIGS. 3A and 3B illustrate a memory module shared by multiple DPEs in a DPE array, according to an example.
Figure 3B:
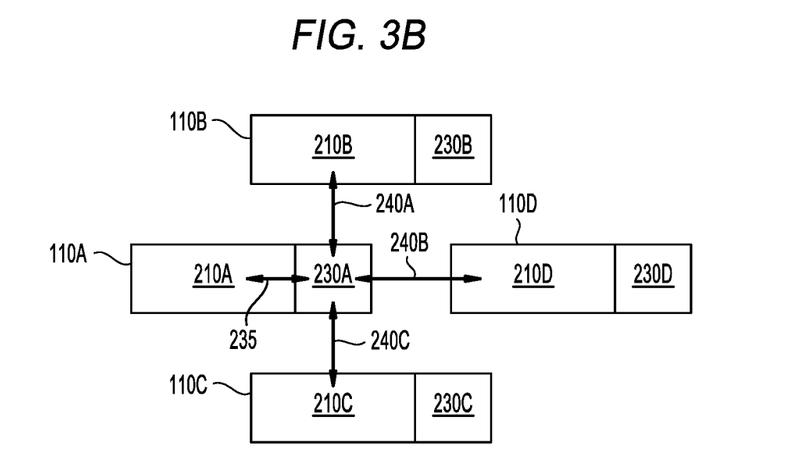

FIGS. 3A-3B illustrate a memory module 230A shared by multiple DPEs 110 in a DPE array, according to an example. As shown, the memory module 230A has direct connections to four cores—i.e., cores 210A-D. The memory module 230A is in the same DPE (i.e., DPE 110A) as the core 210A. As such, the direct connection 235 is an intra-engine connection. However, the memory module 230A is in a different DPE than the cores 210B-D. As such, the direct neighboring connections 240A-C are inter-engine connections since these connections 240 span across an interface between DPEs 110 in the array. For clarity, the interconnects in each of the DPEs 110 have been omitted.

In FIG. 3A, the memory module 230A in the DPE 110A is disposed to the right of the core 210A. The same is true for the DPE 110D located to the right of the DPE 110A (i.e., is east of the DPE 110A). As such, the core 210D in the DPE 110D directly neighbors the memory module 230A which makes establishing the direct neighboring connection 240B between the memory module 230A and the core 210D easier than if the memory module 230D were disposed to the left of the core 210D—i.e., if the memory module 230D were disposed between the memory module 230A and the core 210D.

Unlike the DPEs 110A and 110D, in the DPEs 110B and 110C, the cores 210B and 210C are disposed to the right of the memory modules 230B and 230C. As a result, the cores 210B and 210C are disposed directly above and directly below the memory module 230A (i.e., the cores 210B and 210C are north and south of the memory module 230A). Doing so makes establishing the direct neighboring connections 240A and 240C between the shared memory module 230A and the cores 210B and 210C easier than if the cores 210B and 210C were disposed to the left of the memory modules 230B and 230C. Using the arrangement shown in FIG. 3A, the memory module 230A has direct connections 235 and 240 to the cores 210A-D that are located in the same DPE and neighboring DPEs which means the memory module 230A is a shared memory for the DPEs 110A-D. Although FIG. 3A illustrates sharing the memory module 230A between four cores 210, in other embodiments the memory module 230A may be shared by more or less cores. For example, the memory module 230A may also have direct connections to neighboring DPEs that are arranged at a diagonal relative to the DPE 110A.

The arrangement of the DPEs 110 illustrated in FIG. 3A is just one example of a suitable arrangement of the DPEs 110 to provide direct connections to the memory module 230A from the neighboring cores 210. In FIG. 3B, the DPEs 110 in the different rows are staggered. That is, instead of the DPEs 110 in the same column being aligned, the DPEs 110 are offset. In this arrangement, the cores 210B and 210C are disposed to the left of the memory modules 230B and 230C (unlike what is shown in FIG. 3A) and still are directly above and beneath the shared memory module 230A by shifting the DPEs 110B and 110C to the right relative to the DPE 110A. As such, the direct connection 240A-C can be formed in the SoC to enable the memory module 230A to be shared by the cores 210A-D.

Moreover, although not shown in FIGS. 3A and 3B, the memory modules 230B-D may also be shared memory modules. For example, the memory module 230D may have direct connection to cores in DPEs that are disposed above, below, and to the right (i.e., to the north, south, and east) of the DPE 110D. In this manner, the memory module 230D can be shared with cores in neighboring DPEs. However, the memory modules 230 in DPEs disposed at the edges or periphery of the array may be shared by fewer numbers of cores (or may not be shared at all).

Figure 4:
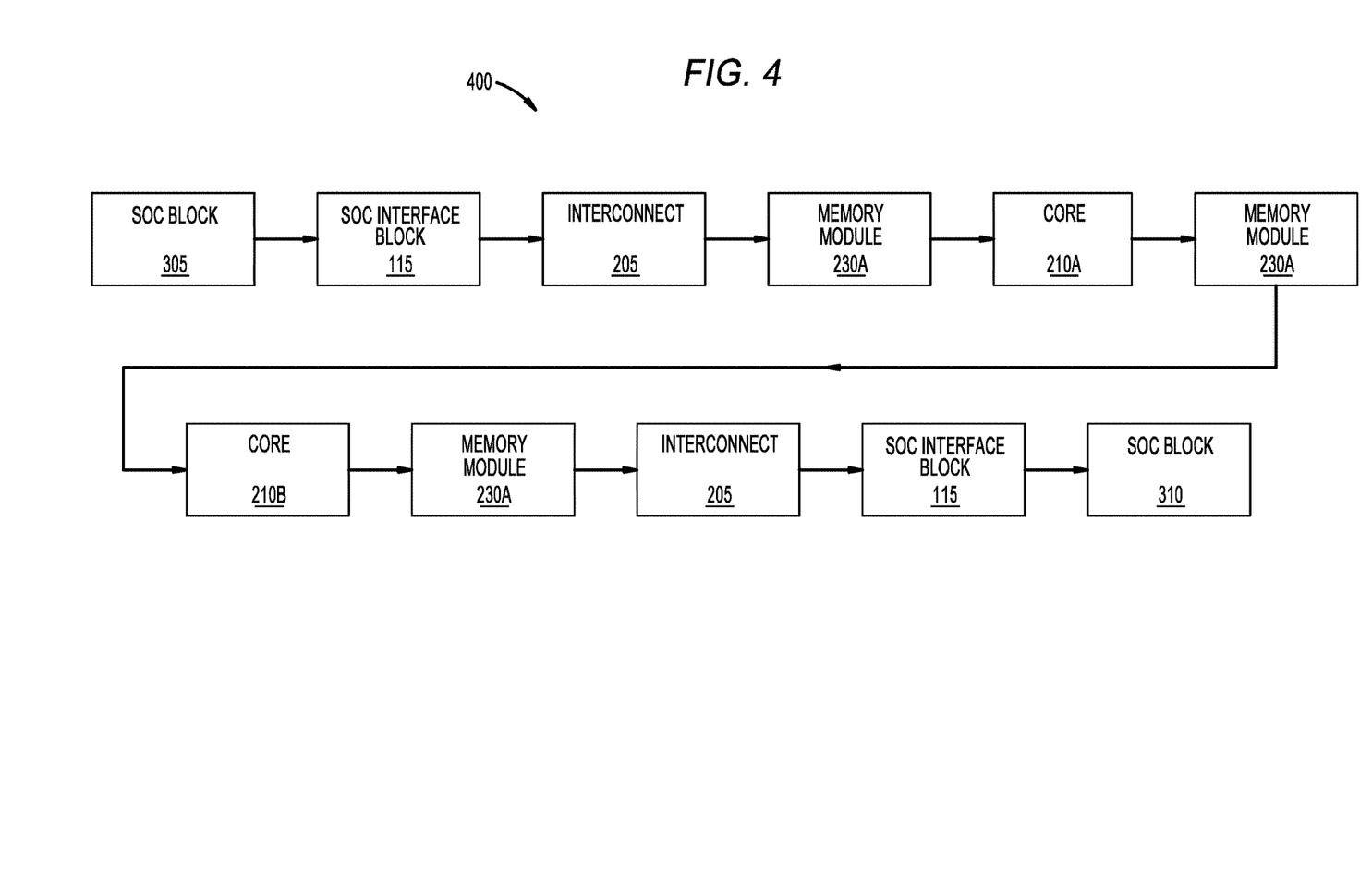
FIG. 4 illustrates a data flow for transferring data between cores using shared memory modules, according to an example.

FIG. 4 illustrates a data flow 400 for transferring data between cores using shared memory modules, according to an example. In one embodiment, the data flow 400 may be associated with the SoC executing an application or thread. For example, the application or thread may be divided into different tasks where each task is assigned to a respective core 210 for execution. In this example, the application or thread has at least two tasks where one of the tasks is assigned to the core 210A and the other task is assigned to the core 210B.

In one embodiment, a compiler or user may assign tasks to specific cores 210. The compiler or user may know which cores 210 in the array share memory modules. Referring to FIGS. 3A and 3B, the compiler may know that the core 210A-210D share the memory module 230A. As such, if the application or thread relies on multiple cores to complete respective tasks, the compiler can select cores to perform those tasks that share memory. As such, when transferring data, the cores can use the shared memory rather than the streaming network formed in the interconnects.

The data flow 400 begins with a SoC block 305 in the SoC transmitting data to the SoC interface block 115. The SoC block 305 could be the NoC which receives data from a PL block, the PS, or I/O module in the SoC which is to be processed by the cores 210. The SoC interface block 115, in turn, uses one or more interconnects 205 to route the data to the memory module 230A where the data is stored.

Once the core 210A is ready to process the data, the core 210A reads the data from the memory module 230A and processes the data. In this example, once finished, the core 210A stores the processed data in the memory module 230A. Because the core 210B has a direct connection the memory module 230A as shown in FIGS. 3A and 3B, the core 210B can retrieve the processed data directly from the memory module 230A. As a result, transferring the data processed by the core 210A to the core 210B may have less latency and require less memory than using the interconnect and copying the data to the memory module 230B that is in the same DPE as the core 210B.

The core 210B can then process the data retrieved from the shared memory module 230A and store the processed data in the memory module 230A. In this manner, the cores 210A and 210B can perform respective tasks in a pipelined application or thread and benefit from the reduced latency offered by using a shared memory module. Although the data flow 400 illustrates using two cores 210, the flow 400 may include any number of cores. For example, instead of the core 210B storing processed data back in the memory module 230A, the core 210B may store the processed data in its memory module 230B. A core in a DPE that neighbors the DPE 110B can then directly read the processed data from the memory module 230B and process the data. That is, the memory module 230B may be shared by multiple cores in neighboring DPEs just like the memory module 230A.

Once the application or thread is complete, the memory module 230A provides the data to the interconnect 205 which routes the data to the SoC interface block 115. In turn, the SoC interface block 115 provides the data to a SoC block 310 (e.g., the NoC or programmable logic). In this manner, hardware components in the SoC can provide data to the DPE array which can be processed by multiple cores 210 using one or more shared memory modules 230.

In one embodiment, the core 210A and 210B may perform multiple tasks in parallel or sequentially. For example, the core 210A may perform Task A and Task B for the same application and thread. If Task B relies on data processed after Task A, each time the core 210A completes Task A, it can store the processed data in the memory module 230A and then retrieve the data once it is ready to perform Task B. That is, the core 210A can use the memory module 230A as a buffer for storing the data. As such, the core 210A can transmit data between tasks that are being executed in parallel or sequentially in the core 210A using the direct connection to the memory module 230A.

Figure 5:
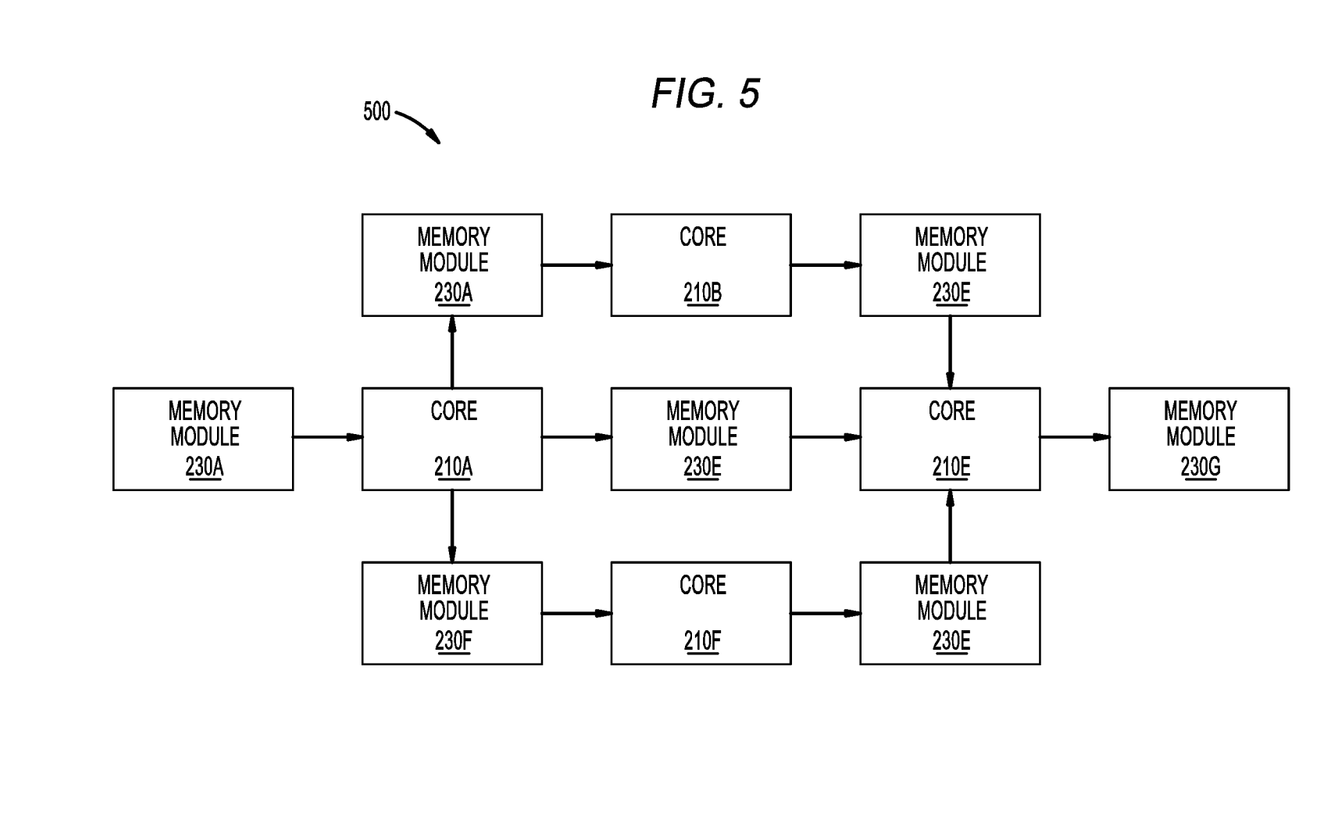
FIG. 5 illustrates a data flow for transferring data between cores using shared memory modules, according to an example.

FIG. 5 illustrates a data flow 500 for transferring data between cores using shared memory modules, according to an example. The data flow 500 begins assuming the data for an application or thread has already been loaded into the memory module 230A. Once ready, the core 210A retrieves the data from the memory module 230A and processes the data.

Unlike in data flow 400, in data flow 500, the core 210A transmits the processed data to different memory modules. That is, the core 210A transmits some or all of the processed data to the memory module 230A (i.e., the local memory module), a memory module 230E, and a memory module 230F. Nonetheless, although the memory modules 230E and 230F are on different DPEs, the core 210 uses direct connections to write the processed data into these the memory modules 230E and 230F. Put differently, the memory modules 230E and 230F are memory modules that are shared by the core 210A and its neighboring DPEs.

The processed data stored in the memory module 230A is retrieved by the core 210B using the direct connection 240A shown in FIG. 3A. The processed data stored in the memory module 230E is retrieved by a core 210E—i.e., the core that is in the same DPE as the memory module 230E. The processed data stored in the memory module 230F is retrieved by a core 210F—i.e., the core that is in the same DPE as the memory module 230F.

The cores 210B, 210E, and 210F can process the data and then store the data in respective memory modules. In this example, the cores 210B and 210F both write the processed data into the memory module 230E—i.e., the local memory module for the core 210E. However, in other embodiments, the cores 210B and 210F can write their data into any memory module that is also shared with the core 210E. Put differently, the cores 210B and 210F can write their data into any memory module to which the cores 210B, 210F, and 210E have a direct connection.

The core 210E retrieves the processed data from the memory module 230E that was provided by the cores 210A, 210B, and 210F. In one embodiment, the cores 210A, 210B, and 210F are allocated different portions or buffers in the memory module 230E. After reading the data, the core 210E may perform an aggregate operation, or use the three sources of data to execute its assigned task or tasks. Once complete, the core 210E stores the data in a memory module 230G which may be a shared memory module in a neighboring DPE. Alternatively, the core 210E may store the processed data back in the memory module 230E.

The data flow 500 illustrates that data can be split and transmitted to different cores and then be aggregated later into one of the cores. Further, the core-to-memory transfers in the data flow 500 can all occur using direct connections which means the data flow 500 can avoid using the interconnects in the various DPEs. That is, a compiler or user can assign the tasks such that each core-to-core transfer in the data flow 500 occurs used a memory module 230 that is shared between the cores 210. Nonetheless, not all of the cores 210 in the data flow 500 may share the same memory modules 230. For example, the core 210E may not have a direct connection to the memory module 230F.

Figure 6:
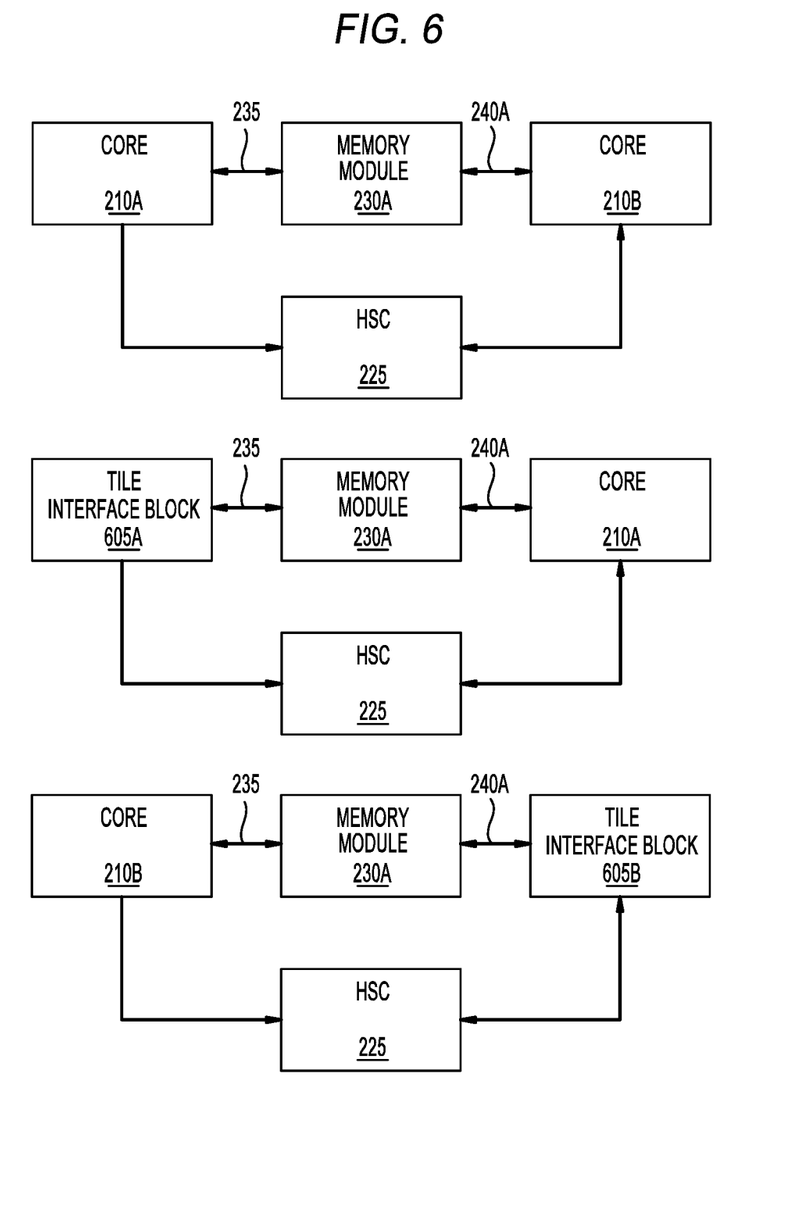
FIG. 6 illustrates transferring data between cores using a shared memory module, according to an example.

FIG. 6 illustrates transferring data between cores 210A and 210B using a shared memory module 230A, according to an example. In one embodiment, the shared memory module 230A is disposed in the same DPE 110 as the core 210A shown in FIG. 2. In contrast, the core 210B is disposed in a different DPE. However, in another embodiment, the cores 210 may communicate using a memory module 230 that is not in a different DPE. Using FIG. 3A as an example, the core 210B may transfer data to the core 210C using the shared memory module 230A. In this example, the cores 210B and 210D are in the DPEs 110B and 110D, respectively, while the memory module 230A is in the DPE 110A. In one embodiment, the HSC 225 is in the same DPE as the memory module 230A.

FIG. 6 also illustrates that a tile interface block 605A (e.g., a memory mapped interconnect, DMA in a memory module, and/or streaming interconnect) can be used to transfer data to the neighboring core 210A using the shared memory module 230A in a similar manner as two cores 210 transferring data as described above. Further, FIG. 6 illustrates that the core 210B can transmit data to a tile interface block 605B using the shared memory module 230A and HSC 225. The middle and bottom circuits in FIG. 6 illustrate how data can enter the DPE array using the tile interface block 605A (e.g., when data is transmitted to the core 210A) as well as how the processed data can exit the array (e.g., when data is transmitted from the core 210B to the tile interface block 605B).

Figure 7A:
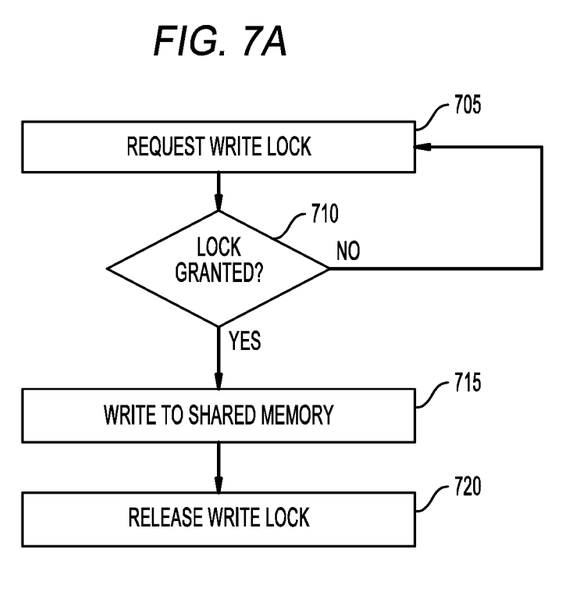
FIGS. 7A and 7B are flowcharts for transferring data between cores using a shared memory, according to an example.
Figure 7B:
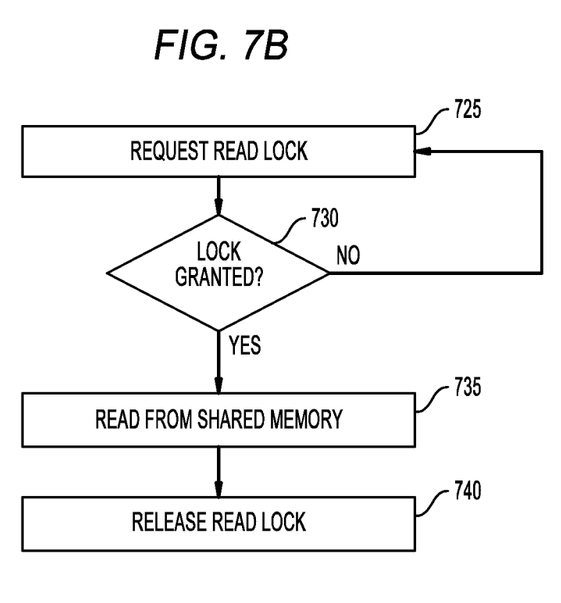

FIGS. 7A and 7B are flowcharts for transferring data between cores using a shared memory, according to an example. For clarity, the blocks in FIGS. 7A and 7B are discussed using the hardware elements illustrated in FIG. 6.

In FIG. 7A, at block 705, a core 210A or tile interface block 605A requests a lock from the HSC 225 to write data for the shared memory 230A. That is, before writing or reading data from the memory module 230A, the cores 210 or tile interface blocks 605 first receive permission from the HSC 225. For example, the core 210A may transmit a request asking the HSC 225 to allocate a block of memory in the memory module (referred to as a buffer) for the core 210A. At block 705, the HSC 225 can identify an unallocated portion of the memory banks in the memory module 230A and grant a lock to the core 210 or tile interface block 605 for that portion of memory.

At block 710, the core 210 or tile interface block 605 determines whether the lock was granted. If granted, at block 715, the core 210A or tile interface block 605A writes data to the allocated portion (i.e., the locked buffer) of the shared memory 230A. For example, the core 210A my write processed data to the memory module 230A as shown in the data flows 400 and 500 in FIGS. 4 and 5. In one embodiment, the core 210A may keep the lock until the core 210A has finished writing the processed data into the buffer. Once finished writing data, the core 210A or tile interface block 605A releases the write lock at block 720.

Referring to FIG. 7B, at block 725 the core 210A, 210B or the tile interface block 605B requests a lock from the HSC 225 to read data from the shared memory module 230A. That is, the HSC 225 permits the core 210 or tile interface block 605B to access the same portion of the memory that was previously allocated to the core 210A or tile interface block 605A. In one embodiment, the core 210 or tile interface block 605B transmits a request to the HSC 225 to access the portion of the shared memory that contains the data written by the core 210A or tile interface block 605A.

At block 730, the core 210A, 210B, or tile interface block 605B determines if the HSC 225 has granted the lock. The HSC 225 may stall that request until the core 210A or tile interface block 605A releases the lock.

Once the lock is granted, at block 735, the core 210 or tile interface block 605B 215B can read data from the portion of the shared memory allocated by the HSC 225. In this manner, the HSC 225 can control access to the shared memory to provide core-to-core communication while avoiding higher latency communication networks such as the streaming network in the interconnect 205. Once finished reading the data, at block 740, the core 210 or tile interface block 605B releases the read lock which makes the shared memory module 230A available to the core 210A or tile interface block 605A to write updated data into the module 230A.

Figure 8A:
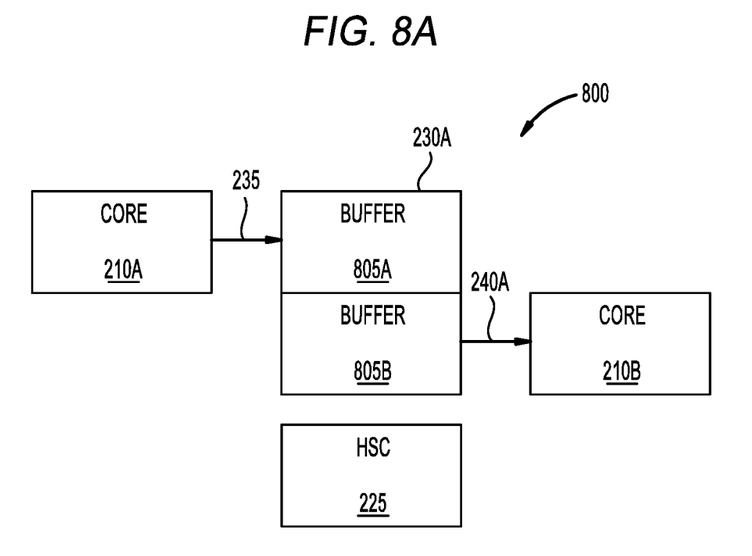
FIGS. 8A and 8B illustrate a system for transferring data between cores using multiple buffers, according to an example.
Figure 8B:
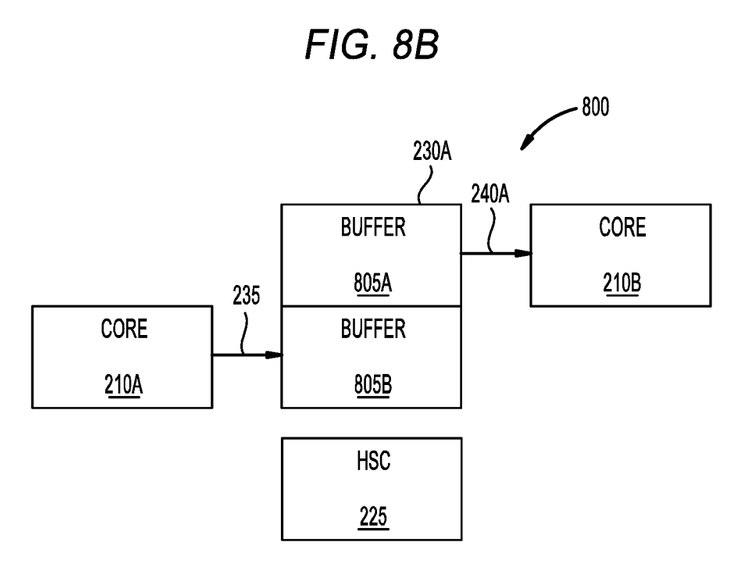

FIGS. 8A and 8B illustrate a system 800 for transferring data between cores 210 using multiple buffers 805, according to an example. In FIGS. 8A and 8B, the buffers 805 are different allocated portions of memory in the same memory module 230A. For example, the buffer 805A is a first memory bank (or group of memory banks) while the buffer 805B is a second memory bank (or group of memory banks) in the memory module 230A. Alternatively, the buffer 805A can be a first portion of a memory bank while the buffer 805 is a second portion of the same memory bank.

FIG. 8A illustrates a time where the core 210A has obtained a lock for the buffer 805A from the HSC 225 while the core 210B has obtained a lock for the buffer 805B. The core 210A is currently writing data into the buffer 805A using the direct connection 235 while the core 210B is currently reading data from the buffer 805B using the direct connection 240A. That is, the core 210A can write data into the memory module 230A in parallel with the core 210B reading data from the memory module 230A. In one embodiment, the core 210A stores processed data into the buffer 805A while the core 210B reads data from the buffer 805B that was previously processed by the core 210A. Once the core 210A has completed writing data into the buffer 805A and the core 210B has completed reading data from the buffer 805B, both cores 210 release their locks which permits the HSC 225 to swap the locks.

FIG. 8B illustrates a later time period where the HSC 225 has swapped the locks by providing a lock to the core 210A for the buffer 805B and a lock to the core 210B for the buffer 805A. As shown, the core 210A overwrites the data previously written into the buffer 805B (which was already read out by the core 210B during the time period shown in FIG. 8A) with new processed data. Moreover, the core 210B reads the processed data from the buffer 805A which was stored there by the core 210A during the time period illustrated in FIG. 8A. Thus, while the core 210A writes updated data into one of the buffers 805, the core 210B can, in parallel, read processed data from the other core 210A. In this manner, by logically dividing the memory in the memory module 230A into multiple buffers 805, the cores 210 can operate simultaneously without waiting for the other core 210 to release its lock. That is, in FIG. 6, the core 210 share the same buffer which means the core 210B waits until the core 210A completes writing data into the memory module 230A before the core 210B can then read out the processed data. Similarly, the core 210A waits until the core 210B has finished reading the data and releases its lock before writing updated data into the memory module 230A. However, in FIGS. 8A and 8B, the cores 210 can switch between the buffers 805 in the same shared memory module 230A which enables the read and write operations to occur in parallel.

Although FIGS. 8A and 8B illustrate transmitting data between the cores 210, in other embodiments, the shared memory module 230A can be used to transfer data from, or to, an interface block as shown in FIG. 6.

Figure 9:
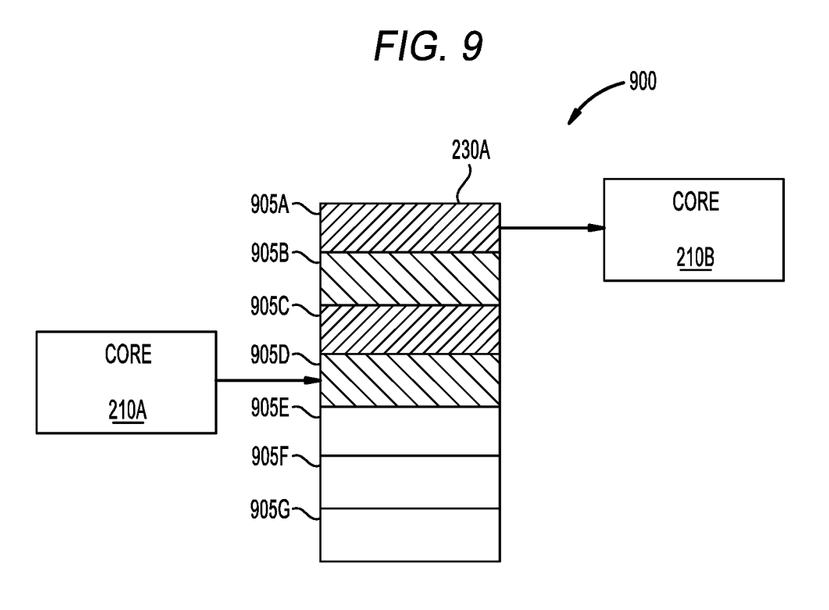
FIG. 9 illustrates a system for transferring data between cores using multiple buffers, according to an example.

FIG. 9 illustrates a system 900 for transferring data between cores using multiple buffers 905, according to an example. In contrast to FIGS. 8A and 8B where the shared memory module 230A is logically divided into two buffers 805, here the shared memory module 230A is logically divided into seven buffers 905, although the module 230A may have fewer or greater buffers 905 than shown. The buffers 805 may be spread across multiple different memory banks in the shared memory module 230A or may be different allocated portions in the same memory bank.

The hashing in FIG. 9 illustrates the buffers 905 that store valid data while the buffers 905 without the hashing are empty or store invalid data (i.e., data that can be overwritten or that has already been read out by the core 210B). Put differently, the buffers 905 without the hashing indicate storage space that is currently available for the core 210A to write in processed data.

One advantage of using three or more buffers in a FIFO to transfer data between the cores 210 is that the cores can operate at different speeds. For example, in FIGS. 8A and 8B, the cores 210 operate at the rate of the slowest core. For example, if it takes longer for the core 210A to perform its task and write the processing data into a buffer than it takes the core 210B to read data and process it, then the core 210B will stall for at least some period while waiting for the core 210A to finish writing the data and releasing the lock to the buffer. However, by using additional buffers in a queue (e.g., a FIFO) as shown in FIG. 9, the cores 210 can operate at different speeds without stalls. For example, if the core 210A can perform its task faster than core 210B, then the core 210A can keep storing processed data in the empty buffers 905 at a faster rate than the core 210B is reading the processed data from the filled buffers 905. Of course, if the core 210A is always faster than the core 210B at processing data, eventually the core 210A will fill up the entire queue in which case the core 210A will stall waiting for the core 210B to read data and provide a new buffer 905 which the core 210A can fill with updated data. However, in some applications, the core 210A may be faster during some time periods but the core 210B is faster during other time periods. As such, the buffers 905 provide flexibility such that if one core is not faster than the other for an extended time periods then both cores 210 can operate without stalls. Put differently, if the core 210A is temporarily faster than the core 210B, then the buffer 905 begins to fill up. However, if the core 210B then performs its task (or tasks) faster than the core 210A (before the buffers 905 are full), then the buffer 905 begins to empty at a faster rate than it is filled. Later, if the cores 210 begin to operate at the same speed (or the core 210A again performs its task faster than the core 210B), then neither core stalls and can operate continuously assuming the buffer 905 does not become completely empty or completely full.

Although FIG. 9 illustrate transmitting data between the cores 210A and 210B, in other embodiments, the shared memory module 230A can be used to transfer data from a DMA engine to a core in a neighboring DPE or transfer data from a core to a DMA engine in a neighboring core.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function (s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A method, comprising:
 processing data in a first data processing engine in a 2D array of data processing engines disposed in a same integrated circuit, wherein each data processing engine comprises a respective processing core and a local memory module;
 storing the processed data in a first local memory module in the first data processing engine;
 retrieving at least a portion of the processed data from the first local memory module using a first direct neighbor connection that directly couples the first local memory module in the first data processing engine to a processing core in a second data processing engine in the 2D array; and retrieving at least a portion of the processed data from the first local memory module using a second direct neighbor connection that directly couples the first local memory module in the first data processing engine to a processing core in a third data processing engine in the 2D array, wherein the second data processing engine is in a different row than the third data processing engine in the 2D array.

2. The method of claim 1, further comprising:
storing the data processed by the second data processing engine in a second local memory module in the second data processing engine; and
retrieving the data in the second local memory module using a third direct neighbor connection that directly couples the second local memory module to a fourth data processing engine in the 2D array.

3. The method of claim 2, wherein the first local memory module is shared between the first and second data processing engines and the second local memory module is shared between the second and third data processing engines but the first local memory module is not shared with the fourth data processing engine.

4. The method of claim 3, wherein the first data processing engine neighbors the second data processing engine in the 2D array, the second data processing engine neighbors the fourth data processing engine in the 2D array, and the first data processing engine does not neighbor the fourth data processing engine in the 2D array.

5. The method of claim 1, further comprising:
storing the processed data in a second local memory module in a fourth data processing engine in the 2D array, wherein the first data processing engine is directly coupled to the second local memory module via a third direct neighbor connection.

6. The method of claim 1, wherein each data processing engine in the 2D array includes a respective interconnect, wherein each respective processing core is directly connected to the respective local memory module in a neighboring data processing engine, wherein the interconnects in the data processing engines are communicatively coupled to provide connectivity between the data processing engines in the 2D array.

7. The method of claim 6, further comprising:
transmitting data from the first data processing engine to a fourth data processing engine in the 2D array using the respective interconnects in the first and fourth data processing engines upon determining the fourth data processing engine does not neighbor the first data processing engine in the 2D array.

8. The method of claim 6, wherein retrieving the processed data from the first local memory module using the first direct neighbor connection avoids using the respective interconnects in the first and second data processing engines and incurs less latency relative to transmitting the processed data using the respective interconnects in the first and second data processing engines.

9. The method of claim 6, wherein the respective core in the second data processing engine is directly coupled to the first local memory module using the first direct neighbor connection.

10. A system on a chip (SoC), comprising:
a first data processing engine in an 2D array of data processing engines, wherein each data processing engine comprises a respective processing core and a local memory module, wherein the first data processing engine is configured to store processed data in a first local memory module; and a second data processing engine in the 2D array, the second data processing engine configured to:
retrieve at least a portion of the processed data from the first local memory module using a first direct neighbor connection that directly couples the first local memory module in the first data processing engine to a processing core in the second data processing engine, and
process the retrieved data; and
a third data processing engine in the 2D array, the third data processing engine configured to:
retrieve at least a portion of the processed data from the first local memory module using a second direct neighbor connection that directly couples the first local memory module in the first data processing engine to a processing core in the third data processing engine, wherein the second data processing engine is in a different row than the third data processing engine in the 2D array, and
process the retrieved data.

11. The SoC of claim 10, wherein the second data processing engine is configured to store first data in a second local memory module in the second data processing engine, the SoC further comprising:
a fourth data processing engine configured to retrieve the first data from the second local memory module using a third direct neighbor connection that directly couples the second local memory module to the fourth data processing engine.

12. The SoC of claim 11, wherein the first local memory module is shared between the first and second data processing engines and the second local memory module is shared between the second and fourth data processing engines but the first local memory module is not shared with the fourth data processing engine.

13. The SoC of claim 12, wherein the first data processing engine neighbors the second data processing engine in the 2D array, the second data processing engine neighbors the fourth data processing engine in the 2D array, and the first data processing engine does not neighbor the fourth data processing engine in the 2D array.

14. The SoC of claim 10, further comprising:
a fourth data processing engine in the 2D array comprising a second local memory module, wherein the first data processing engine is configured to store the processed data in the second local memory module, wherein the first data processing engine is directly coupled to the second local memory module via a third direct neighbor connection.

15. The SoC of claim 10, wherein each data processing engine in the 2D array includes a respective interconnect, wherein each respective processing core is directly connected to the respective local memory module in a neighboring data processing engine, wherein the interconnects in the data processing engines are communicatively coupled to provide connectivity between the data processing engines in the 2D array.

16. The SoC of claim 15, further comprising:
a fourth data processing engine in the 2D array, wherein the first data processing engine is configured to transmit data to the fourth data processing engine using the respective interconnects in the first and fourth data processing engines upon determining the fourth data processing engine does not neighbor the first data processing engine in the 2D array.

17. The SoC of claim 15, wherein retrieving the processed data from the first local memory module using the first direct neighbor connection avoids using the respective interconnects in the first and second data processing engines and incurs less latency relative to transmitting the processed data using the respective interconnects in the first and second data processing engines.

18. The SoC of claim 15, wherein the respective core in the second data processing engine is directly coupled to the first local memory module using the first direct neighbor connection.

19. The SoC of claim 10, further comprising:
   a SoC interface block communicatively coupling the 2D array to at least one hardware component configured to transmit data to the first data processing engine using the SoC interface block.

20. The SoC of claim 19, wherein the first data processing engine comprises programmable logic in a field programmable gate array (FPGA) or an application specific integrated circuit (ASIC).

* * * * *